US009437694B1

(12) United States Patent
Gaumer et al.

(10) Patent No.: US 9,437,694 B1
(45) Date of Patent: Sep. 6, 2016

(54) TRANSISTOR WITH A LOW-K SIDEWALL SPACER AND METHOD OF MAKING SAME

(71) Applicant: STMicroelectronics (Crolles 2) SAS, Crolles (FR)

(72) Inventors: Clement Gaumer, Tencin (FR); Daniel Benoit, Saint-Ismier (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 14/676,369

(22) Filed: Apr. 1, 2015

(51) Int. Cl.
| | |
|---|---|
| *H01L 21/8232* | (2006.01) |
| *H01L 29/417* | (2006.01) |
| *H01L 29/51* | (2006.01) |
| *H01L 29/66* | (2006.01) |
| *H01L 21/283* | (2006.01) |
| *H01L 29/78* | (2006.01) |
| *H01L 21/8234* | (2006.01) |

(52) U.S. Cl.
CPC ....... *H01L 29/41783* (2013.01); *H01L 21/283* (2013.01); *H01L 29/517* (2013.01); *H01L 29/518* (2013.01); *H01L 29/665* (2013.01); *H01L 29/6656* (2013.01); *H01L 29/78* (2013.01); *H01L 21/823468* (2013.01)

(58) Field of Classification Search
CPC .............................................. H01L 21/823468
USPC ........................................................ 257/288
See application file for complete search history.

(56) References Cited

U.S. PATENT DOCUMENTS

| 6,194,748 B1* | 2/2001 | Yu ..................... H01L 21/28194 257/216 |
|---|---|---|
| 2008/0029834 A1* | 2/2008 | Sell ..................... H01L 29/4983 257/411 |
| 2013/0187229 A1* | 7/2013 | Cheng ................... H01L 29/772 257/347 |
| 2013/0277686 A1* | 10/2013 | Liu ..................... H01L 29/6653 257/77 |
| 2014/0035040 A1* | 2/2014 | Le Royer ............ H01L 29/7831 257/365 |
| 2014/0110798 A1* | 4/2014 | Cai ........................ H01L 29/78 257/410 |
| 2014/0295637 A1* | 10/2014 | Mehta ................. H01L 29/6653 438/300 |
| 2015/0091089 A1* | 4/2015 | Niebojewski ....... H01L 29/0843 257/347 |
| 2015/0111350 A1* | 4/2015 | Alptekin ............... H01L 29/772 438/197 |
| 2015/0236113 A1* | 8/2015 | Song ................... H01L 29/4983 257/411 |
| 2015/0243760 A1* | 8/2015 | He .................... H01L 29/66545 257/288 |
| 2015/0249036 A1* | 9/2015 | Cai ................... H01L 21/76805 257/382 |

OTHER PUBLICATIONS

Planes, N., et al: "28nm FDSOI Technology Platform for High-Speed Low-Voltage Digital Applications," 2012 Symposium on VLSI Technology Digest of Technical Papers, 2012 IEEE (pp. 133-134).

(Continued)

*Primary Examiner* — George Fourson, III
(74) *Attorney, Agent, or Firm* — Gardere Wynne Sewell LLP

(57) ABSTRACT

A transistor is formed by defining a gate stack on top of a semiconductor layer. The gate stack includes a gate dielectric and a gate electrode. A layer of a first dielectric material, having a first dielectric constant, is deposited on side walls of the gate stack to form sacrificial sidewall spacers. Raised source-drain regions are then epitaxially grown on each side of the gate stack adjacent the sacrificial sidewall spacers. The sacrificial sidewall spacers are then removed to produce openings between each raised source-drain region and the gate stack. A layer of a second dielectric material, having a second dielectric constant less than the first dielectric constant, is then deposited in the openings and on side walls of the gate stack to form low-k sidewall spacers.

15 Claims, 7 Drawing Sheets

(56) References Cited

OTHER PUBLICATIONS

Weber, O., et al: "14nm FDSOI Technology for High Speed and Energy Efficient Applications," 2014 Symposium on VLSI Technology Digest of Technical Papers, 2014 IEEE (2 pages).

Ko, C.H., et al: "A Novel CVD-SiBCN Low-K Spacer Technology for High-Speed Applications," 2008 Symposium on VLSI Technology Digest of Technical Papers, 2008 IEEE (pp. 108-109).

Huang, Elbert, et al: "Low-K Spacers for Advanced Low Power CMOS Devices with Reduced Parasitic Capacitances," 2008 IEEE International SOI Conference Proceedings, 2008 IEEE (pp. 19-20).

* cited by examiner

TRANSISTOR WITH A LOW-K SIDEWALL SPACER AND METHOD OF MAKING SAME

TECHNICAL FIELD

The present invention relates to the fabrication of integrated circuits and, more particularly, to a process for fabricating a transistor having a low-k sidewall spacer.

BACKGROUND

Reference is now made to FIGS. 1-9 showing process steps for fabricating an integrated circuit transistor device such as a MOSFET transistor. It will be understood that the illustrations provided do not necessarily show the features drawn to scale.

The process starts with a substrate 10 as shown in FIG. 1. The substrate 10 comprises, for example, a silicon on insulator (SOI) substrate including a semiconductor substrate layer 12, an insulating (buried oxide) layer 14 and a semiconductor layer 16. The SOI substrate may, for example, be of a conventional SOI-type or comprise an extremely thin silicon on insulator (ETSOI) type or an ultra-thin body and buried oxide (UTBB) silicon on insulator type as known to those skilled in the art. The semiconductor layer 16 may be formed of any suitable semiconductor material, including silicon or silicon-germanium, and may be doped as appropriate for the given transistor application. In an embodiment, the SOI substrate 10 may be of the fully-depleted type (known in the art by the acronym FD-SOI). In an example implementation, the semiconductor substrate layer 12 may have a thickness of 500-800 nm, the insulating (buried oxide) layer 14 may have a thickness of 20-100 nm and the semiconductor layer 16 may have a thickness of 6-20 nm. Techniques for fabricating SOI substrates are well known to those skilled in the art and SOI wafers for use in semiconductor fabrication processes are available from a number of known commercial sources.

Next, an active region 20 of the substrate 10 is delimited by the formation of shallow trench isolation (STI) structures 22. The result is shown in FIG. 2. Any suitable process known to those skilled in the art for the formation of STI structures may be used. The active region is reserved for the formation of one or more transistor devices (for example, of the MOSFET-type). The techniques described herein are applicable to transistors of both the n-type and p-type of conductivity.

FIG. 3 shows the deposition of a high-k metal gate stack layer 26 on the top surface of the semiconductor layer 16. The stack layer 26 may, for example, comprise a pedestal high-k dielectric layer and a metal gate electrode layer. For example, the high-k dielectric can be hafnium oxide or hafnium silicate, nitrided or not, deposited in a layer using Metal Organic Chemical Vapor Deposition (MOCVD) or Atomic Layer Deposition (ALD), with a thickness from 2 to 5 nm. The metal gate electrode, such as titanium nitride, may be deposited in a layer using Physical Vapor Deposition (PVD) or Atomic Layer Deposition (ALD) with a thickness of 2-20 nm.

A polysilicon layer 30 is then deposited on top of the high-k metal gate stack layer 26. The result is shown in FIG. 4. The polysilicon layer 30 may be deposited using a low pressure chemical vapor deposition (LPCVD) process to a thickness of, for example, 20-60 nm. The polysilicon layer 30 may be doped as necessary for the transistor application.

A hard mask layer 34 is then deposited on top of the polysilicon layer 30. The hard mask layer 34 may, for example, comprise an oxide layer (made of silicon, oxide, hydrogen and nitrogen atoms) and deposited using a plasma enhanced chemical vapor deposition (PECVD) process. Alternatively, the hard mask layer 34 may comprise a multi-layer structure such as with an oxide-nitride-oxide stack of layers deposited using a PECVD process. The hard mask layer 34 may, for example, have a thickness of 20-70 nm. The result is shown in FIG. 5.

Using conventional photolithographic processing techniques known to those skilled in the art, the hard mask layer 34 is patterned to define masking portions 38 as shown in FIG. 6 at locations where a gate of the transistor is desired.

An etching process (such as, for example, a reactive ion etch (RIE)) is then used to remove the portions of the layers 26 and 30 which are not covered by the masking portions 38 (thus exposing the top surface of the semiconductor layer 16). The result of this etch is shown in FIG. 7 to form a gate stack 40 including a high-k/metal gate layer 42 (from patterned layer 26), a polysilicon gate 44 (from patterned layer 30) and a cap (formed by the masking portion 38).

A conformal layer 50 of an insulating spacer material is then deposited over the substrate. The layer 50 may, for example, comprise a silicon nitride ($Si_3N_4$) material deposited using a low pressure chemical vapor deposition (LP-CVD) process or atomic layer deposition (ALD) process with a thickness of 3-13 nm. The result is shown in FIG. 8.

An etching process (such as, for example, a reactive ion etch) is then performed which preferentially removes portions of the conformal layer 50 which lie on horizontal surfaces of the wafer. The result of this etch is shown in FIG. 9 to form sidewall spacers 52 on the side walls of the gate stack 40.

An epitaxial growth process as known to those skilled in the art is then performed to grow an epitaxial semiconductor layer 60 on the top surface of the semiconductor layer 16. The result is also shown in FIG. 9. The layer 60 may, for example, comprise silicon, silicon carbide or silicon germanium epitaxially grown to a thickness of 10-40 nm. The layer 60 may, if desired, be in situ doped in accordance with the transistor application. The portions of the layer 60 on each side of the gate stack 40 adjacent to the sidewall spacers 52 are provided to form raised source-drain regions 62 for the transistor. The channel of the transistor is provided by the portion of the semiconductor layer 16 located underneath the gate stack 40.

It is understood by those skilled in the art that the etching process for preferential removal of the horizontal portions of the layer 50 may be followed by a pre-epitaxial desoxidation (referred to as a hydrofluoric (HF) acid last processing step) which does not remove any more of the layer 50 but effectuates a cleaning of the top surface of the semiconductor layer 16 in preparation for subsequent epitaxial growth.

It is noted that due to the presence of the raised source-drain regions 62 with the sidewall spacers 52, the parasitic capacitance between the source or drain region and the polysilcon gate 44 electrode can be unacceptably high because of the higher k silicon nitride dielectric materials typically used for the sidewall spacers 52, thus leading to a loss in dynamic performance of the transistor device.

There would be an advantage if the sidewall spacers 52 could be made of a lower k dielectric material. The prior art notes the possible use of relatively-lower k dielectric materials in sidewall spacer formation. However, such materials often require a relatively high process temperature (for example, >500° C.) which is disadvantageous with respect to other processing steps. Still further, such relatively-lower k dielectric materials (for example, silicon oxycarbonitride (SiOCN)) can be damaged by the etch and desoxidation process steps. Indeed, such materials can be converted from a lower k material (such as SiOCN) which addresses the concerns with parasitic capacitance to a higher k material (such as silicon dioxide) with a corresponding loss of the desired lower k dielectric characteristic.

There is accordingly a need in the art to address the foregoing and other concerns with the fabricating of transistor devices with low-k dielectric sidewall spacers.

SUMMARY

In an embodiment, a process comprises: forming a gate stack on top of a semiconductor layer, said gate stack including a gate dielectric and a gate electrode; forming a sacrificial sidewall spacer on each side of the gate stack; epitaxially growing raised source-drain regions on each side of the gate stack adjacent the sacrificial sidewall spacers; removing the sacrificial sidewall spacers to produce openings between each raised source-drain region and the gate stack; and filling the openings with a dielectric material having a dielectric constant k<5.

In an embodiment, an integrated circuit comprises: a substrate; a gate stack on top of the substrate, said gate stack including a gate dielectric and a gate electrode; raised source-drain regions on each side of the gate stack, wherein each raised source-drain region is separated from a side of the gate stack by a space; and a dielectric material having a dielectric constant k<5 that fills the spaces between the sides of the gate stack and each raised source-drain region.

In an embodiment, a process comprises: defining a gate stack on top of a semiconductor layer, said gate stack including a gate dielectric and a gate electrode; depositing a layer of a first dielectric material having a first dielectric constant on side walls of the gate stack to form sacrificial sidewall spacers; epitaxially growing raised source-drain regions on each side of the gate stack adjacent the sacrificial sidewall spacers; removing the sacrificial sidewall spacers to produce openings between each raised source-drain region and the gate stack; and depositing a layer of a second dielectric material having a second dielectric constant less than the first dielectric constant in said openings and on side walls of the gate stack to form low-k sidewall spacers.

BRIEF DESCRIPTION OF THE DRAWINGS

For a better understanding of the embodiments, reference will now be made by way of example only to the accompanying figures in which.

DETAILED DESCRIPTION

Reference is now additionally made to FIGS. 10-19 showing further process steps for fabricating an integrated circuit transistor device comprising a MOSFET transistor. It will be understood that the illustrations provided do not necessarily show the features drawn to scale.

The process steps shown in FIGS. 1-9 are incorporated by reference. The process embodiment described herein is a continuation of the process illustrated by FIGS. 1-9. As a distinction over the processing techniques described above, the sidewall spacers 52 formed in FIGS. 8 and 9 comprise sacrificial sidewall spacer structures.

Figure 1:
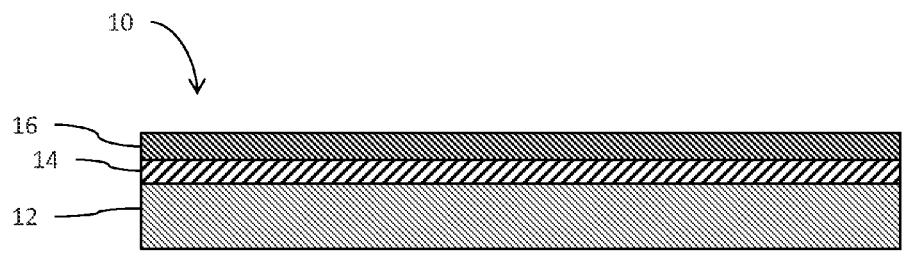
FIGS. 1-9 show process steps for the formation of a MOSFET transistor.
Figure 2:
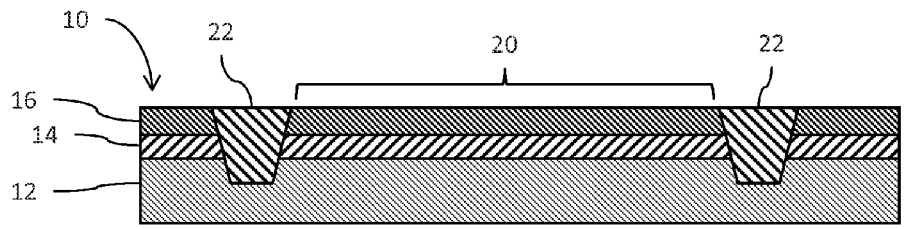
Figure 3:
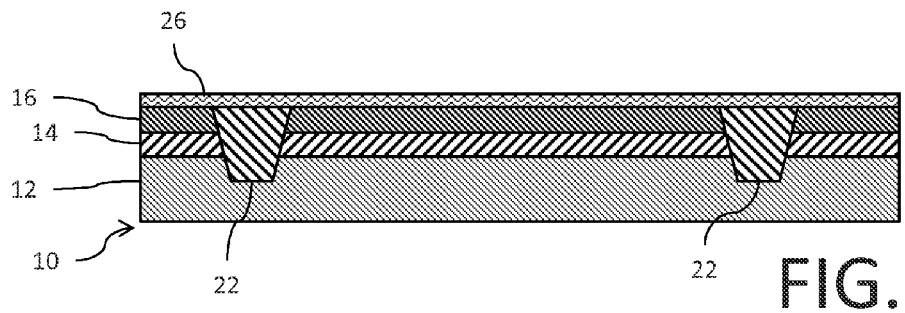
Figure 4:
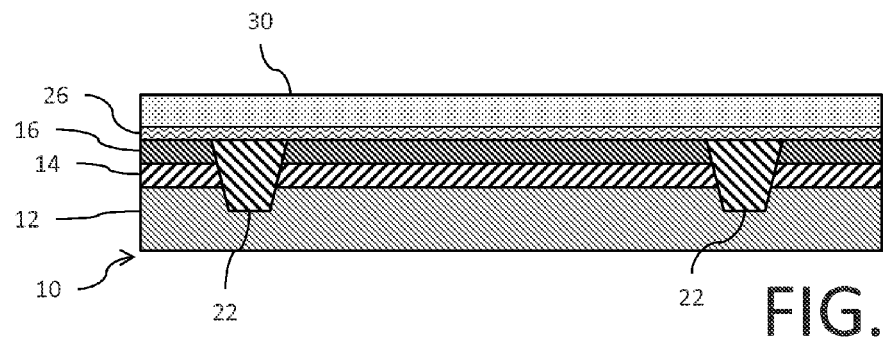
Figure 5:
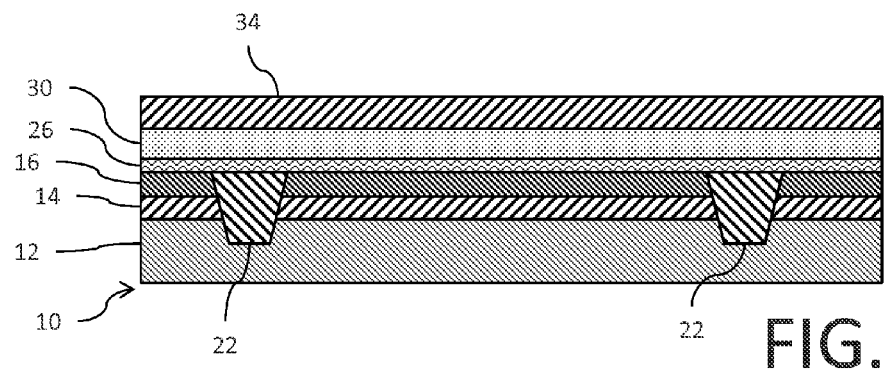
Figure 6:
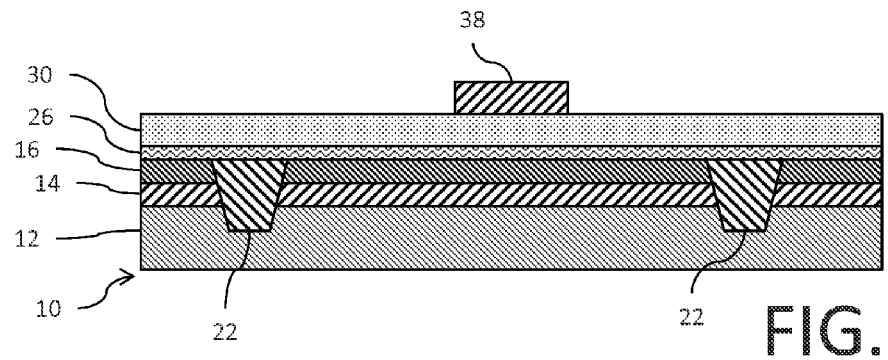
Figure 7:
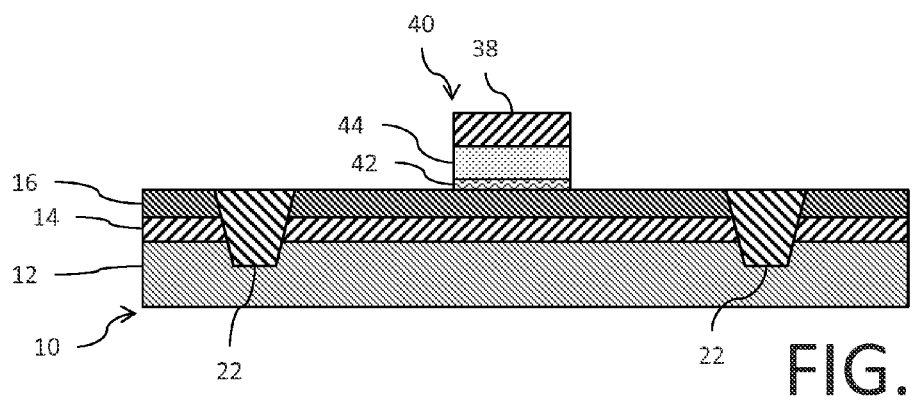
Figure 8:
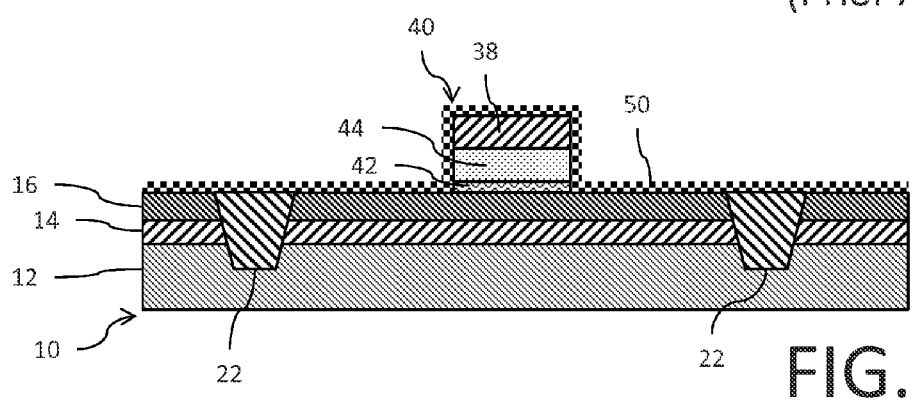
Figure 9:
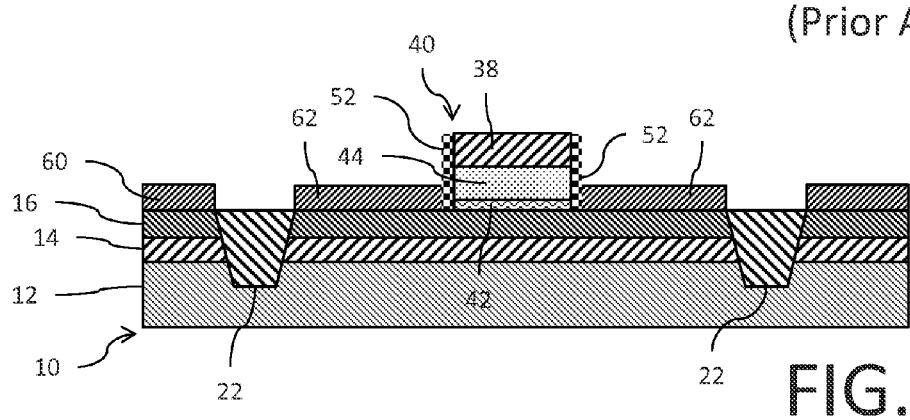
Figure 10:
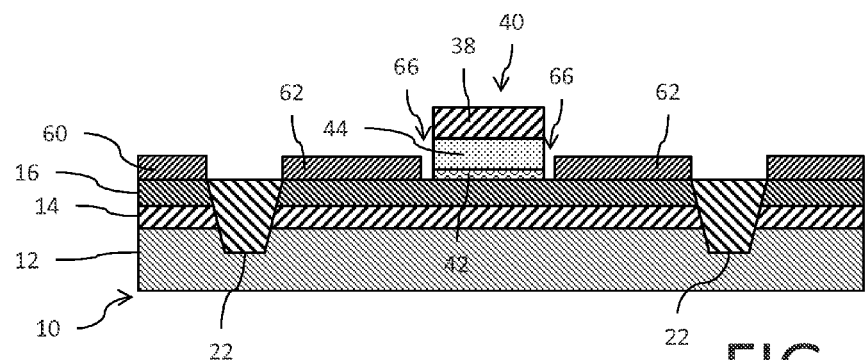
FIGS. 10-19 show further process steps for fabricating a MOSFET transistor in accordance with an embodiment.

Continuing from FIG. 9, the sacrificial sidewall spacers 52 are removed using a preferential etch process. The etch may, for example, comprise a wet etch such as an $H_3PO_4$ (wet chemistry) etch or a diluted HF etch. The result is shown in FIG. 10, where the removal of the sacrificial sidewall spacers 52 leaves sidewall openings 66 defining spaces between the gate stack 40 and the adjacent raised source-drain regions 62. The openings 66 extend down to the top surface of the semiconductor layer 16.

Figure 11:
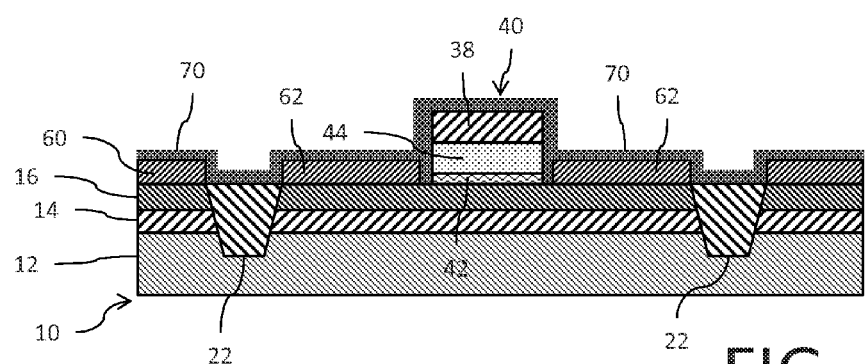

A conformal layer 70 of an insulating spacer material is then deposited over the substrate. The layer 70 may, for example, comprise a low-k dielectric material (preferably, with a dielectric constant k<5) such as a silicon oxycarbonitride (SiOCN) material, a silicon carbon oxide (SiCO) material, a silicon carbon nitride (SiCN) or a silicon boron carbon nitride (SiBCN) material deposited using a plasma enhanced atomic layer deposition (PEALD) process, an atomic layer deposition (ALD) process, a low pressure chemical vapor deposition (LPCVD) process or a plasma enhanced chemical vapor deposition (PECVD) process with a thickness of 3-13 nm. The result is shown in FIG. 11. It will be noted that the layer 70 fills the sidewall openings 66 and is thus positioned in the spaces between the sides of the gate stack and each raised source-drain region 62.

Figure 12:
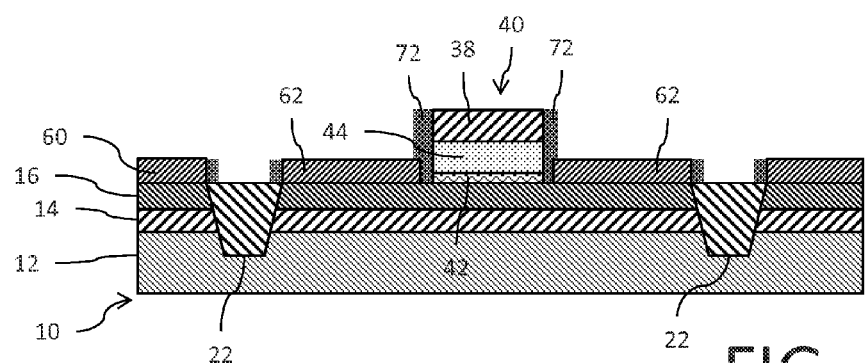

An etching process (such as, for example, a reactive ion etch) is then performed which preferentially removes portions of the conformal layer 70 which lie on horizontal surfaces. The result of this etch is shown in FIG. 12 to form low-k dielectric material sidewall spacers 72 on the side walls of the gate stack 40.

If the raised source-drain regions 62 were not previously in situ doped during the epitaxial growth process, at this point in the transistor fabrication process a dopant implantation may be performed.

Figure 13:
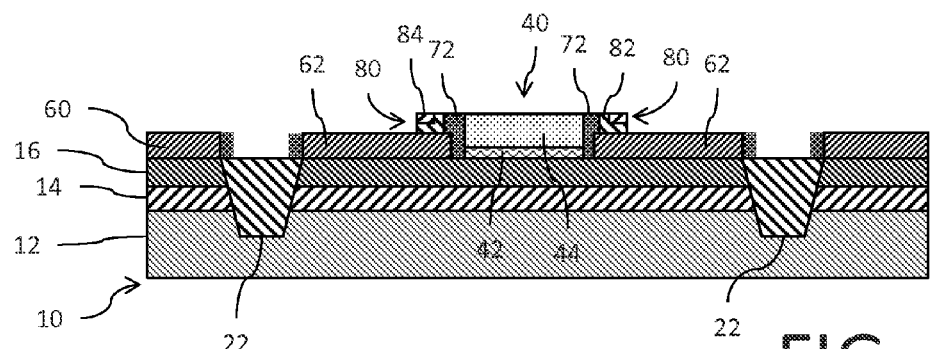

The process then continues to finish fabrication of the transistor which includes low-k dielectric sidewall spacers 72. A silicide protection (SiPROT) technique as known to those skilled in the art is used to define SiPROT spacers 80 on each side of the sidewall spacers 72. The spacers 80 are formed, for example, of a conformal oxide (reference 82) deposition adjacent the sidewall spacers 72 and a conformal nitride (reference 84) deposition on the oxide deposition. Using a mask and preferential etch, portions of the conformal deposits which are not along and adjacent the sidewall spacers 72 are removed so as to expose a top surface of the source-drain regions 62. This etch will additionally remove the cap formed by the masking portion 38 of the gate stack 40 so as to expose a top surface of the polysilicon gate 44. The result is shown in FIG. 13.

It is understood by those skilled in the art that the etching process for preferential removal of the horizontal portions of the conformal oxide and nitride layers may be followed by a pre-salicidation desoxidation (referred to as a hydrofluoric (HF) acid last processing step) which does not remove any more of the spacers 80 but effectuates a cleaning of the top surfaces of the semiconductor layer 16 and polysilicon gate 44 in preparation for subsequent silicide formation. It will be recognized that the SiPROT spacers 80 serve to protect the low-k dielectric material sidewall spacers 72 (especially in the region between the gate stack 40 and the source-drain regions 62) from damage from this acid process step which would otherwise adversely affect the low-k dielectric characteristic of the spacer material. Damage at the upper portions of the low-k dielectric material sidewall spacers 72 (near the top surface of the polysilicon gate 44) from the HF last clean is of less consequence because of its remote location relative to the source-drain regions 62.

Figure 14:
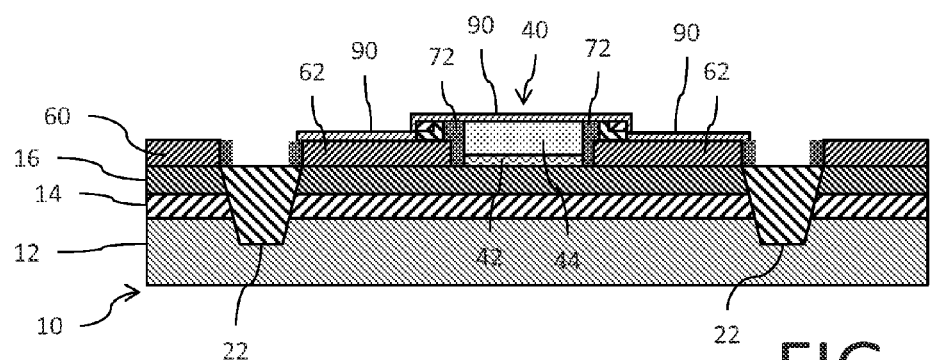

A metal layer 90 is then conformally deposited at least over the active region to cover the source-drain regions 62 and the polysilicon gate 44 (as well as the SiPROT spacers 80). The layer 90 may comprise, for example, an alloy of nickel (Ni) and platinum (Pt) deposited using a physical vapor deposition process with a thickness of 5-40 nm. The result is shown in FIG. 14.

Figure 15:
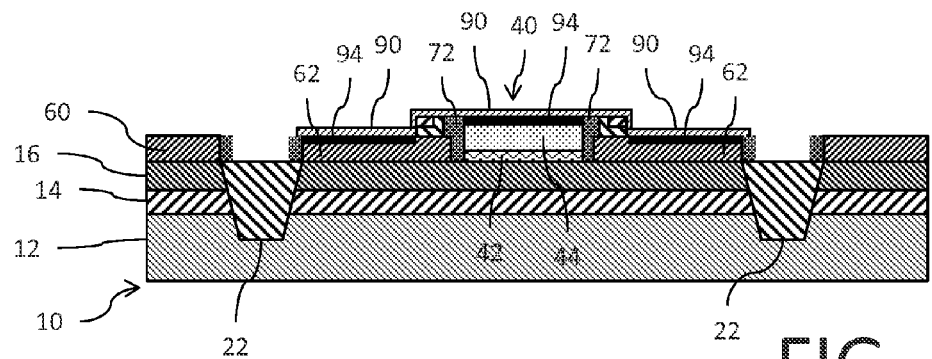

A first rapid thermal anneal (RTA) is then performed to convert the upper surfaces of the semiconductor layer 16 and polysilicon gate 44 to a metal silicide 94 (for example, NiSi, NiSiC or NiSiGe depending on the nature of the underlying silicon-based material). The result is shown in FIG. 15.

Figure 16:
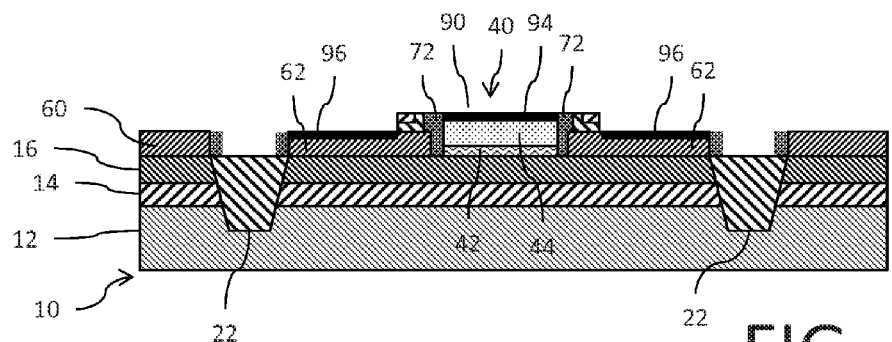

The un-reacted portion of the metal layer 90 is then removed using a selective wet etching process. A second rapid thermal anneal (RTA) is then performed to complete formation of silicide regions 96. The result is shown in FIG. 16.

Figure 17:
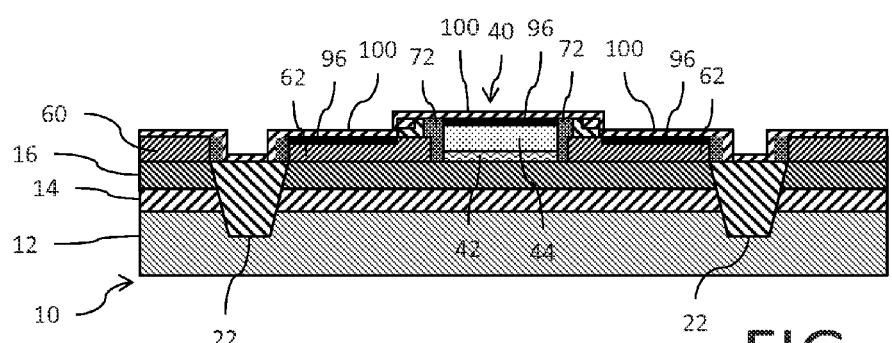

A contact etch stop layer 100 is then conformally deposited. The layer 100 may, for example, comprise silicon nitride or silicon carbide nitride deposited using a PECVD process with a thickness of 10-40 nm. The result is shown in FIG. 17.

Figure 18:
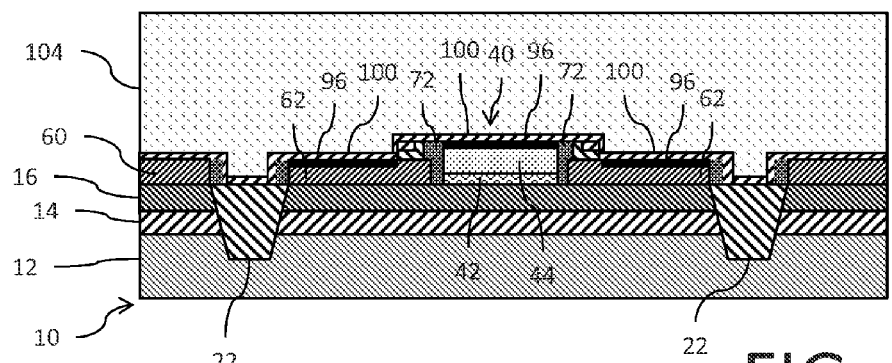

A pre-metal dielectric layer 104 is then deposited and its top surface polished to provide a planar surface. The layer 104 may, for example, be made of a silicon oxide material with a planarized thickness of 50-500 nm. The result is shown in FIG. 18.

Figure 19:
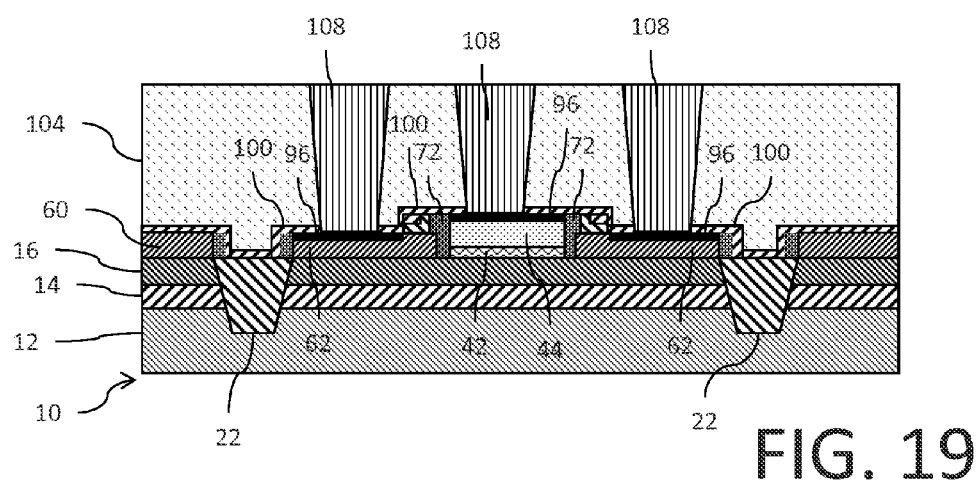

Using conventional contact formation techniques, openings are etched through the pre-metal dielectric layer 104 to reach the silicide regions 96. These openings are then lined and filled with a metal material (for example, tungsten) to form source, drain and gate contacts 108 for the transistor. The result is shown in FIG. 19.

While the implementation described above is presented in the context of fabricating a planar MOSFET device, it will be understood that the technique for replacement of a sacrificial sidewall spacer with a low-k sidewall spacer is equally applicable to the fabrication of many other transistor types such as for transistors used in flash-type memories, bipolar transistors or FINFET devices.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A process, comprising:
forming a gate stack on top of a semiconductor layer, said gate stack including a gate dielectric and a gate electrode;
forming a sacrificial sidewall spacer on each side of the gate stack;
epitaxially growing raised source-drain regions on each side of the gate stack adjacent the sacrificial sidewall spacers;
removing the sacrificial sidewall spacers to produce openings between each raised source-drain region and the gate stack; and
filling the openings with a dielectric material having a dielectric constant k<5, wherein the dielectric material having the dielectric constant k<5 is selected from the group consisting of: a silicon oxycarbonitride (SiOCN) material, a silicon carbon oxide (SiCO) material, a silicon carbon nitride (SiCN) and a silicon boron carbon nitride (SiBCN) material.

2. The process of claim 1, wherein the sacrificial sidewall spacer is formed of a material having a dielectric constant k>5.

3. The process of claim 1, wherein the sacrificial sidewall spacer is formed of a silicon nitride material.

4. The process of claim 1, wherein the semiconductor layer is an upper layer of a silicon on insulator (SOI) substrate.

5. The process of claim 1, further comprising siliciding an upper surface of the gate electrode.

6. The process of claim 1, further comprising siliciding an upper surface of each raised source-drain region.

7. The process of claim 1, wherein the gate electrode and raised source-drain regions are portions of a MOSFET.

8. A process, comprising:
defining a gate stack on top of a semiconductor layer, said gate stack including a gate dielectric and a gate electrode;
depositing a layer of a first dielectric material having a first dielectric constant on side walls of the gate stack to form sacrificial sidewall spacers;
epitaxially growing raised source-drain regions on each side of the gate stack adjacent the sacrificial sidewall spacers;
removing the sacrificial sidewall spacers to produce openings between each raised source-drain region and the gate stack; and
depositing a layer of a second dielectric material having a second dielectric constant less than the first dielectric constant in said openings and on side walls of the gate stack to form low-k sidewall spacers, wherein the second dielectric material is selected from the group consisting of: silicon oxycarbonitride (SiOCN), silicon carbon oxide (SiCO), silicon carbon nitride (SiCN) and silicon boron carbon nitride (SiBCN).

9. The process of claim 8, wherein the first dielectric constant is k>5 and the second dielectric constant is k<5.

10. The process of claim 8, wherein the first dielectric material is silicon nitride.

11. A process, comprising:
forming a gate stack on top of a semiconductor layer, said gate stack including a gate dielectric and a gate electrode;
forming a sacrificial sidewall spacer on each side of the gate stack;
epitaxially growing raised source-drain regions on each side of the gate stack adjacent the sacrificial sidewall spacers;
removing the sacrificial sidewall spacers to produce openings between each raised source-drain region and the gate stack; and
filling the openings with a dielectric material selected from the group consisting of: a silicon oxycarbonitride (SiOCN) material, a silicon carbon oxide (SiCO) material, a silicon carbon nitride (SiCN) and a silicon boron carbon nitride (SiBCN) material.

12. The process of claim 11, wherein the semiconductor layer is an upper layer of a silicon on insulator (SOI) substrate.

13. The process of claim 11, further comprising siliciding an upper surface of the gate electrode.

14. The process of claim 11, further comprising siliciding an upper surface of each raised source-drain region.

15. The process of claim 11, wherein the gate electrode and raised source-drain regions are portions of a MOSFET.

* * * * *